United States Patent [19]

Knijnenburg et al.

[11] 4,409,558
[45] Oct. 11, 1983

[54] GAIN COMPENSATED TRANSISTOR AMPLIFIER

[75] Inventors: Johannus P. H. Knijnenburg; Bernardus Verhoeven, both of Nijmegen, Netherlands

[73] Assignee: U.S. Philips Corporation, New York, N.Y.

[21] Appl. No.: 230,568

[22] Filed: Feb. 2, 1981

[30] Foreign Application Priority Data

Feb. 25, 1980 [NL] Netherlands .......................... 8001116

[51] Int. Cl.³ .............................................. H03F 3/04
[52] U.S. Cl. ..................................... 330/288; 330/298
[58] Field of Search ................ 330/288, 298; 323/315, 323/316; 307/297

[56] References Cited

U.S. PATENT DOCUMENTS 3,831,040  8/1974  Namba et al. ................... 323/315 X Primary Examiner—James B. Mullins
Attorney, Agent, or Firm—Robert T. Mayer; Bernard Franzblau

[57] ABSTRACT

An amplifier arrangement for use in power protection circuits comprises two transistors arranged as a current mirror. The signal voltage is applied to the emitter electrode of one of the two transistors and the collector of the other transistor provides an output voltage via a resistor. The input circuit of the current mirror, in which the one transistor is included, is driven by a current source. Via an emitter-follower transistor the current source is coupled to the common base electrodes of the two transistors. The collector current of said emitter-follower transistor is fed to a tapping on said resistor in order to compensate for variations in the current gain factor of the transistors.

6 Claims, 1 Drawing Figure

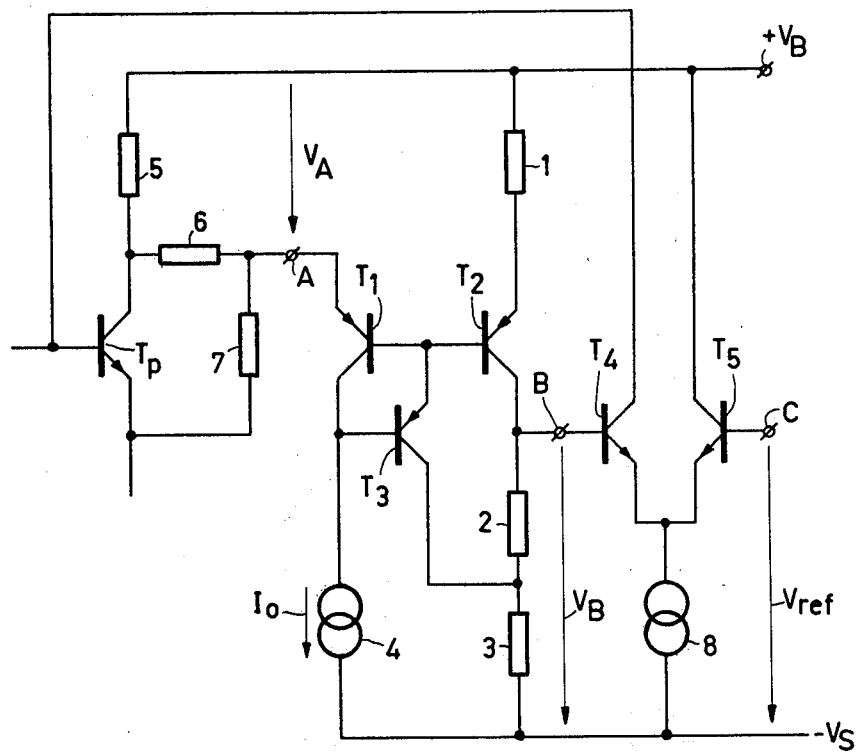

GAIN COMPENSATED TRANSISTOR AMPLIFIER

BACKGROUND OF THE INVENTION

The invention relates to an amplifier arrangement comprising an input and an output, first and second transistors of the same conductivity type whose base electrodes are interconnected, the emitter electrode of the first transistor being connected to the input, the emitter of the second transistor being connected to a first common point via a first resistor, the collector of the first transistor being connected to a quiescent-current source, and the collector of the second transistor being connected to the output and, via a second resistor, to a power-supply terminal.

Such an amplifier arrangement is inter alia employed in SOAR protection circuits in integrated power amplifiers, as is described in "Neues aus der Technik," No. 3, 1977, article number 406, page 4.

In this circuit arrangement a voltage which is a measure of the current, voltage and/or power load of an output transistor in the power amplifier is applied to the input. The amplifier circuit is then proportioned so that at the critical point, i.e. the point at which the protection circuit should be actuated, the voltage across the first resistor is equal to the voltage at said input. The combination of the first and the second transistor operate as a current mirror with the first transistor connected as a diode. At this point a current equal to the current supplied by the quiescent current source will flow through the first resistor and produce a voltage across said resistor to which a circuit can respond which limits the drive of said protected output transistor.

Especially in an integrated circuit with p-type substrate, which is generally employed in practice, when the first and second transistors are pnp-transistors they will be of the lateral type so that they will have a comparatively low current gain factor, which is moreover subject to a substantial spread owing to process variations. As a result of this, the collector current of the second transistor at said actuating point will not be equal to the collector current of the first transistor and will be greatly dependent on process variation so that the point at which the protection circuit is actuated is subject to a substantial spread. This is highly undesirable because, in order to obtain a maximum output power of an integrated circuit, the protection circuit of the output transistor should not be actuated until an extreme value is reached.

SUMMARY OF THE INVENTION

It is an object of the invention to provide an amplifier arrangement of the type mentioned in the preamble in which, for a voltage on the input at which the voltage across the first resistor is equal to the voltage on said input, the voltage at the output depends on the current gain factor of the first and the second transistor to a minimal extent.

To this end the invention comprises a base drive circuit having an input which is connected to the collector electrode of the first transistor. A voltage follower output is connected to the base electrode of the first and second transistors for driving said base electrodes so that the current in the first transistor is equal to the quiescent current from said quiescent-current source. A base-current diverting output, on which at least a part of the base currents of the first and the second transistor appears, is connected to a tapping on the second resistor at a location such that the voltage across the second resistor depends on the current gain factors of the first and the second transistor to a minimal extent when the voltage on the input, which is connected to the emitter of the first transistor, has a value such that said voltage corresponds to the voltage across the first resistor.

Owing to the drive at the tapping on the second resistor, a variation of the current gain factor of the two transistors, which variation results in a variation in the collector current of the second transistor, produces an opposite variation of the current applied to the tapping of the second resistor, which in the case of a correct location of said tapping, which may for example be determined experimentally, leads to a substantially full compensation at the said actuation point.

BRIEF DESCRIPTION OF THE DRAWING

The invention will be described in more detail with reference to the accompanying drawing. In this drawing, the sole FIGURE of which illustrates a circuit diagram of a preferred embodiment of the invention transistor $T_p$ is the power transistor to be protected.

The collector lead of transistor $T_p$ includes a resistor 5 for measuring the collector current of transistor $T_p$. This resistor is generally selected to have a very small value and may for example be constituted by the resistance of a connecting track or a connecting point. Between the collector and the emitter of transistor $T_p$ a voltage divider consisting of the resistors 6 and 7 is included for measuring the collector-emitter voltage of transistor $T_p$. The junction point of the resistors 6 and 7 is connected to input A of the protection circuit and by a suitable choice of the values of resistors 5, 6 and 7 the voltage $V_A$ at point A can be an optimum function of the current through and the voltage across the transistor $T_p$ to be protected for current, voltage and power limitation. The protection circuit comprises an amplifier including pnp-transistors $T_1$ and $T_2$ whose base electrodes are interconnected. The emitter electrode of transistor $T_1$ is connected to input A, whereas the emitter of transistor $T_2$ is connected to the power supply terminal $+V_B$ via a resistor 1. The collector of transistor $T_1$ is connected to a quiescent-current source 4 providing a current $T_o$, while the collector of transistor $T_2$ is connected to an output B and, via resistors 2 and 3, to a negative supply voltage terminal $-V_s$. The base electrodes of transistors $T_1$ and $T_2$ are connected to the emitter electrode of a transistor 3 whose base electrode is connected to the collector electrode of transistor $T_1$ and whose collector electrode is connected to the junction point between resistors 2 and 3. Transistor $T_3$ drives transistor $T_1$ in such a way that it carries the current $I_o$ supplied by the current source 4. Output B leads to the base of transistor $T_4$, which is arranged as a differential pair with a transistor $T_5$. The base electrode of transistor $T_5$ is connected to a point C at a reference voltage $V_{ref}$. The collector electrode of the transistor $T_4$ is connected to the base electrode of the transistor $T_p$ to be protected.

Resistor 1 is dimensioned so that when the voltage $V_A$ reaches a value at which transistor $T_p$ is to be protected, transistors $T_1$ and $T_2$ both carry the current $I_o$ supplied by the current source 4 (ignoring the base current loss). Resistors 2 and 3 are then dimensioned so that the voltage $V_B$ at point B is then equal to the reference voltage $V_{ref}$. At the point where the protection circuit is actuated the current, which is supplied to transistors $T_4$ and $T_5$ by the common emitter current source 8, is transferred from transistor $T_5$ to transistor $T_4$ and via the collector of transistor $T_4$ is diverted from the base electrode of the transistor $T_p$ to be protected, whose drive thereby is limited at said protection point.

The current gain factor $\beta$ of the lateral pnp-transistors $T_1$, $T_2$ and $T_3$ exhibits a spread in respect of process variations and moreover is greatly dependent on the value of the bias current $I_o$, which may exhibit a spread as a result of process variations. In practice this may give rise to a variation of the $\beta$ between for example 3 and 30 in integrated circuits whose integration process is suitable for comparatively large currents. This may lead to a deviation in the collector current of transistor $T_2$ relative to the current $I_o$ a maximum $\pm 15\%$, which in its turn leads to an equal error in the voltage $V_B$, i.e. the value of the voltage $V_A$ at which the drive of transistor $T_p$ will be limited. For the protection of transistors in integrated power amplifiers this is an impermissible variation and in practice means that transistor $T_p$ is limited to a dissipation which is 15% smaller than the optimum value.

According to the invention this problem can be mitigated by feeding the drive of transistors $T_1$ and $T_2$ to a junction point between resistors 2 and 3 via transistor $T_3$, or alternatively via a transistor arrangement comprising a plurality of transistors. In this way the collector current of transistor $T_3$, or the output current of such a combination, produces an extra voltage at point B. A decrease of the current gain factor of transistors $T_1$ and $T_2$ causes a decrease of the collector current of transistor $T_2$ and at the same time an increase of the collector current of transistor $T_3$ so that, by a suitable choice of the ratio of the values of the resistors 2 and 3, the effect of a variation in $\beta$ on the voltage $T_B$ is largely cancelled.

What is claimed is:

1. Am amplifier arrangement comprising an input terminal and an output terminal, a first and a second transistor of the same conductivity type whose base electrodes are interconnected, means connecting the emitter electrode of the first transistor to the input terminal, means connecting the emitter of the second transistor to a first common circuit point via a first resistor, means connecting the collector of the first transistor to a quiescent-current source, means connecting the collector of the second transistor to the output terminal and, via a second resistor, to a power-supply terminal, a base drive circuit having an input connected to the collector electrode of the first transistor, a voltage follower output connected to the base electrodes of the first and second transistors for driving said base electrodes so that the current in the first transistor is equal to the quiescent current from said quiescent-current source, and a base-current diverting output to which at least a part of the base currents of the first and second transistors flow, and means connecting said base-current diverting output to a tapping on the second resistor located so that the voltage across the second resistor depends on the current gain factors of the first and second transistors to a minimal extent when the voltage at the input terminal has a value that corresponds to the voltage across the first resistor.

2. An amplifier comprising an input terminal for a signal voltage and an output terminal for connection to a load, first and second transistors of the same conductivity type having their base electrodes connected together, a source of bias current, means connecting the first transistor and the current source in series between said input terminal and a first point of reference voltage, first and second resistors, means connecting said first resistor, said second transistor and said second resistor in series, in the order named, between a second point of reference voltage and said first point of reference voltage and with an output electrode of the second transistor connected to the second resistor and to said output terminal, an emitter-follower transistor having a control electrode coupled to a junction point between the first transistor and the current source and an emitter-collector path connected between the interconnected base electrodes of the first and second transistors and a tapping on the second resistor located so that a change in the current gain factor of at least one of said first and second transistors produces compensating voltage changes at said output terminal and at said tapping on the second resistor.

3. An amplifier as claimed in claim 2, wherein said tapping is chosen so that said compensating voltage changes are produced when the voltage at said input terminal corresponds to the voltage across said first resistor.

4. An amplifier as claimed in claim 2, wherein said first and second transistors and said emitter-follower transistor are all PNP transistors with the emitter and collector of the first transistor connected to the input terminal and the base of the emitter-follower transistor, respectively, the emitter and collector of the second transistor connected to the first and second resistors, respectively, and the emitter and collector of the emitter-follower transistor connected to the interconnected base electrodes of the first and second transistors and to said tapping on the second resistor, respectively.

5. An amplifier as claimed in claim 2 adapted to limit the base drive to a transistor power amplifier at a given signal level comprising, means for coupling said input terminal to an output of said transistor power amplifier, and a transistor amplifier having a given threshold level and having a control electrode coupled to said output terminal and a main current path coupled to the base of the transistor power amplifier, said threshold level being chosen so that said transistor amplifier begins to conduct when the signal voltage at said input terminal corresponds to the voltage drop across said first resistor.

6. An amplifier as claimed in claim 3 adapted to limit the base drive to a transistor power amplifier at a given signal level comprising, means for coupling said input terminal to an output of said transistor power amplifier, a transistor differential amplifier comprising third and fourth transistors having emitter electrodes interconnected to said first point of reference voltage via a source of constant current, means connecting the base electrodes of the third and fourth transistors to the output terminal and to a source of reference voltage, respectively, and means connecting the collector electrodes of the third and fourth transistors to the base of said transistor power amplifier and to the second point of reference voltage, respectively.

* * * * *